(12) United States Patent
Tomlinson

(10) Patent No.: US 11,415,253 B2
(45) Date of Patent: *Aug. 16, 2022

(54) QUICK CONNECT WITH VISUAL INDICATOR

(71) Applicant: Ford Global Technologies, LLC, Dearborn, MI (US)

(72) Inventor: Samuel Jeffrey Tomlinson, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 498 days.

This patent is subject to a terminal disclaimer.

(21) Appl. No.: 16/417,498

(22) Filed: May 20, 2019

(65) Prior Publication Data

US 2019/0271426 A1 Sep. 5, 2019

Related U.S. Application Data

(62) Division of application No. 14/924,406, filed on Oct. 27, 2015, now Pat. No. 10,337,656.

(51) Int. Cl.
| | |
|---|---|
| *F16L 37/12* | (2006.01) |
| *G06T 7/00* | (2017.01) |
| *F16L 37/088* | (2006.01) |
| *G06F 30/00* | (2020.01) |
| *F16L 55/07* | (2006.01) |
| *G01B 11/14* | (2006.01) |
| *G01B 11/26* | (2006.01) |

(52) U.S. Cl.
CPC ........... *F16L 37/12* (2013.01); *F16L 37/0885* (2019.08); *F16L 55/07* (2013.01); *G01B 11/14* (2013.01); *G01B 11/26* (2013.01); *G06F 30/00* (2020.01); *G06T 7/0004* (2013.01); *F16L 2201/10* (2013.01); *Y10S 285/921* (2013.01)

(58) Field of Classification Search
CPC ............... F16L 37/0885; F16L 37/0844; F16L 37/0847; F16L 37/096; F16L 37/098; F16L 37/0985; F16L 37/127; F16L 37/133; F16L 2201/10; Y10S 285/921
USPC .......................................... 285/93, 307, 308
See application file for complete search history.

(56) References Cited

U.S. PATENT DOCUMENTS

| | | | |
|---|---|---|---|
| 4,399,554 A | 8/1983 | Perkins, III et al. | |
| 4,925,217 A | 5/1990 | Ketcham | |
| 5,152,555 A | 10/1992 | Szabo | |

(Continued)

FOREIGN PATENT DOCUMENTS

| | | | |
|---|---|---|---|
| WO | 9712170 A1 | 4/1997 | |
| WO | 9822743 A1 | 5/1998 | |

OTHER PUBLICATIONS

Golnabi, H. et al., "Design and application of industrial machine vision systems," Robotics and Computer-Integrated Manufacturing, vol. 23, No. 6, Dec. 2007, 8 pages.

(Continued)

*Primary Examiner* — Aaron M Dunwoody
(74) *Attorney, Agent, or Firm* — Vincent Mastrogiacomo; McCoy Russell LLP

(57) ABSTRACT

Devices and assemblies are provided for a quick connect device. In one example, a connector may include a first visual cue for coupling an outer portion to a middle portion and a second visual cue for coupling an inner portion to the middle portion.

15 Claims, 4 Drawing Sheets

(56) References Cited

U.S. PATENT DOCUMENTS

| | | | |
|---|---|---|---|
| 5,354,106 A * | 10/1994 | Washizu | F16L 37/0985 |
| | | | 285/319 |
| 5,662,359 A | 9/1997 | Kargula | |
| 5,676,403 A | 10/1997 | Klinger et al. | |
| 7,681,926 B2 | 3/2010 | Valaskovic et al. | |
| 8,336,919 B2 | 12/2012 | Gillet et al. | |
| 10,167,983 B2 * | 1/2019 | Tomlinson | G06F 30/00 |
| 2005/0189764 A1 | 9/2005 | Ono | |
| 2006/0131418 A1 | 6/2006 | Testa | |
| 2007/0126232 A1 | 6/2007 | Campagna et al. | |
| 2008/0290654 A1 | 11/2008 | Sawada | |
| 2010/0127492 A1 | 5/2010 | Poder et al. | |
| 2014/0144410 A1 | 5/2014 | Barthel et al. | |
| 2014/0284915 A1 | 9/2014 | Arnold et al. | |
| 2017/0018067 A1 | 1/2017 | Rourke et al. | |

OTHER PUBLICATIONS

Michalos, G. et al., "Automotive assembly technologies review: challenges and outlook for a flexible and adaptive approach," CIRP Journal of Manufacturing Science and Technology, vol. 2, No. 2, Jan. 6, 2010, 11 pages.

* cited by examiner

QUICK CONNECT WITH VISUAL INDICATOR

CROSS REFERENCE TO RELATED APPLICATION

The present application is a divisional of U.S. Non-Provisional patent application Ser. No. 14/924,406, entitled "QUICK CONNECT WITH VISUAL INDICATOR," and filed on Oct. 27, 2015. The entire contents of the above-referenced application are hereby incorporated by reference for all purposes.

FIELD

The present description relates generally to the design of a connection system with a visible arm in an air, fuel or other hydraulic systems of an automotive engine or vehicle.

BACKGROUND/SUMMARY

Automotive internal combustion engine fuel systems may use connectors to couple components of the fuel line. For example, connectors may be used to join fuel lines with system components such as engine fuel rails, fuel tanks, evaporative emission control canisters, etc. Likewise, connectors may be used to join lines for pumping hydraulic fluid. Fuel lines can be used to transport liquid fuel from the fuel tank to a fuel injector and to transfer fuel vapor to an evaporative emission control canister. Due to their location, such connectors may be subjected to stress, such as during installation, service repair procedures, diurnal heating/cooling, and due to impact from a vehicle crash. When fuel line connectors are subjected to external and/or internal stresses, the stress may be concentrated at the joints of the connector, leading to potential degradation and increased hydrocarbon emissions.

One example fuel line connector is shown by Arnold et al. in US 20140284915. Therein a locking quick connector assembly is described with a twist lock mechanism. A locking mechanism of the twist lock may produce an audible sound upon a complete lock being achieved between a quick connector and its housing.

However, the inventors herein have recognized potential issues with such connectors. As one example, despite producing an audible sound, a user and/or machine may not hear the audible sound produce when completely locking the quick connector to its housing due to noises from a surrounding environment or lack of attention. Also, the connector of Arnold fails to provide any visual cues in response to a complete lock between the quick connector and a spigot of a fuel and/or hydraulic system. As a result, the connector of Arnold may be difficult to use in determining if a complete connection between a spigot, a quick connector, and a quick connector housing is achieved.

The inventors herein have recognized the above issues and developed a quick connector configuration that may include an indicating arm by which the issues described above may be at least partly addressed. One example of such a quick connect device comprising a middle portion with an extendable arm protruding radially outward over a protrusion of an inner portion, and a second flexibly extendable arm above the first arm that is pushed radially outward by the protrusion only when an annular recess of the middle portion is fully engaged with the protrusion and a separate, axially aligned outer portion having a window exposing and enabling the second arm of the middle portion to be extended when fully engaged with the inner portion. In this way, a complete connection of the quick connect device to the PCV (positive crankcase ventilation) tube of the engine (e.g., a spigot) may be determined via a visual cue.

As one example, a quick connect device may be designed for use in fuel lines and hydraulic lines that can stand a high level of internal and external stress. The middle portion may rotatably or slidingly couple to the outer portion along a shared axial (vertical) axis with the first arm exposed outside an outer circumference of the quick connect device. The second flexible arm does not extend outside the outer circumference of the quick connect device until the protrusion of the inner portion is fully engaged with the annular recess of the middle portion. The second arm is pushed radially outward in a tangential direction through a viewing window of the quick connect housing. At an assembly facility or a service station, an operator and/or visualization machine may be able to determine complete connection of the middle portion to the inner portion via measuring one or more of an angle and a distance between the second arm and the outer circumference of the quick connect device. By using the machine (e.g., a computer) to determine complete connection of the quick connect device to the tube, human error may be decreased.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIGS. 1-7 are shown to scale, although other relative dimensions may be used if desired.

DETAILED DESCRIPTION

Figure 1:
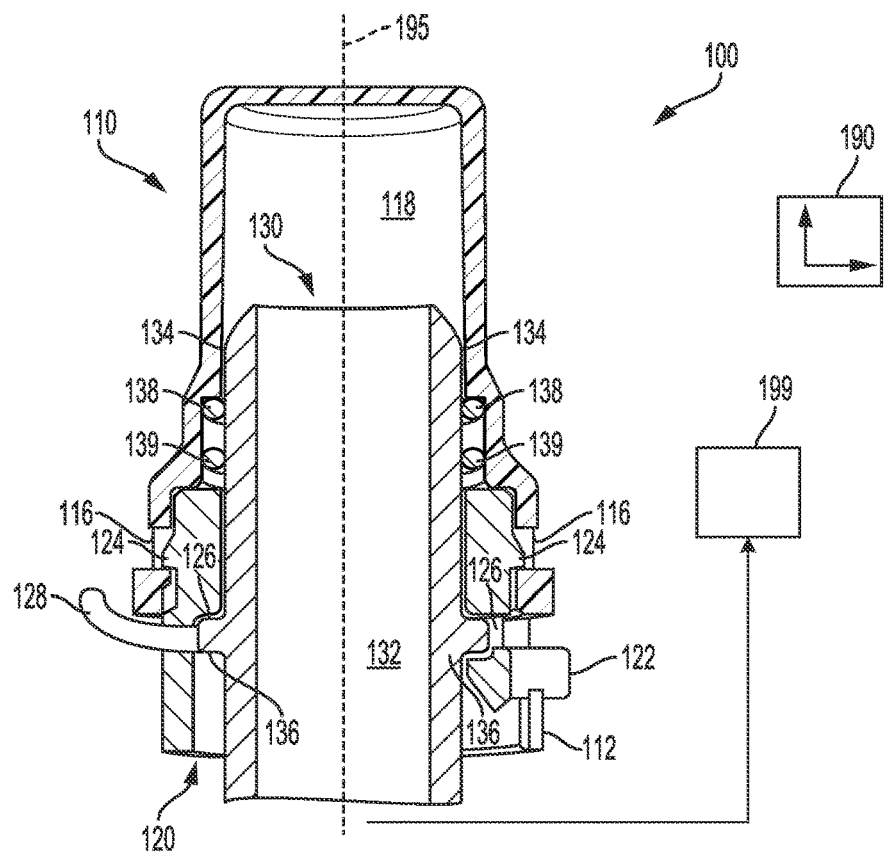
FIG. 1 is a cross-sectional view of an assembled connector assembly.
Figure 2:
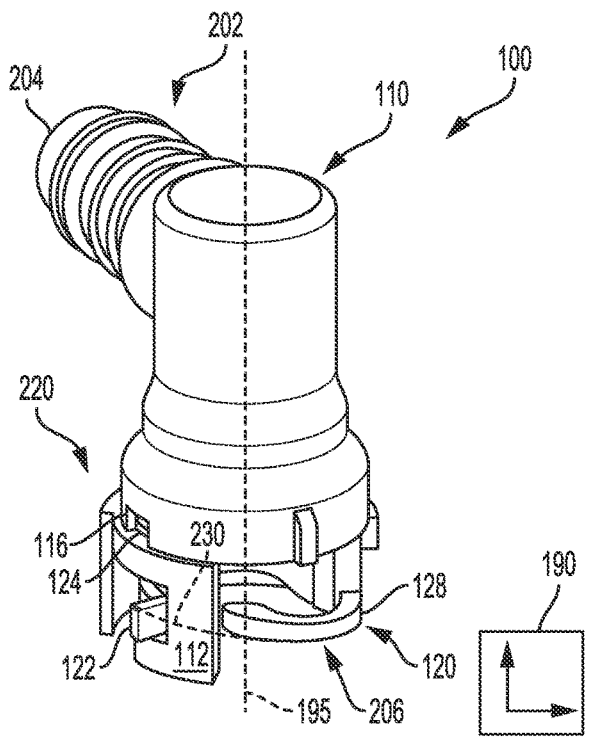
FIG. 2 is a perspective view of the assembled connector assembly.
Figure 3:
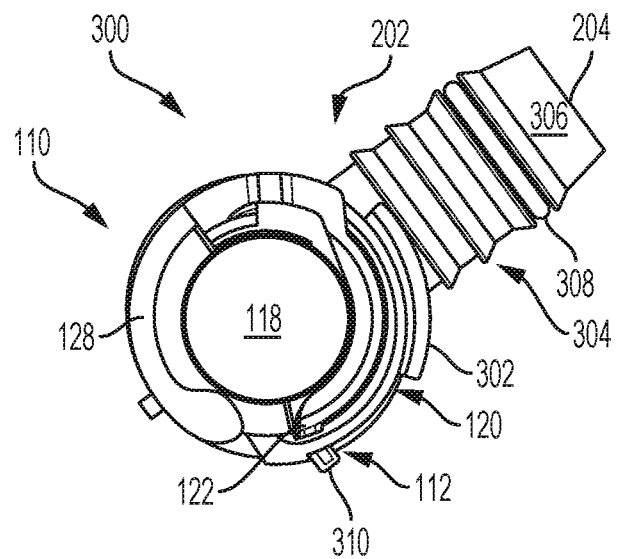
FIG. 3 is a bottom-up view of an outer portion coupled to a middle locking portion.
Figure 4:
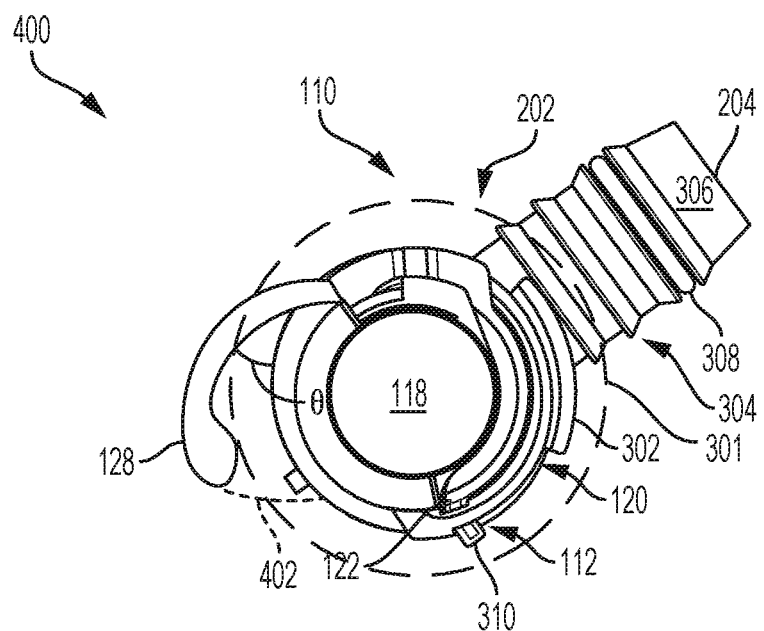
FIG. 4 is a bottom-up view of the assembled connector assembly.
Figure 5:
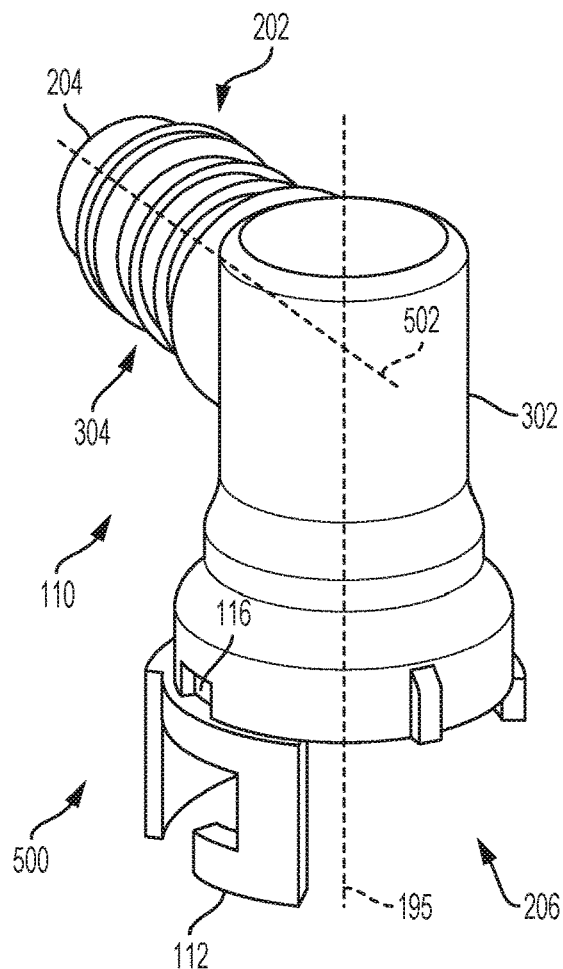
FIG. 5 is a perspective view of the outer portion.
Figure 6:
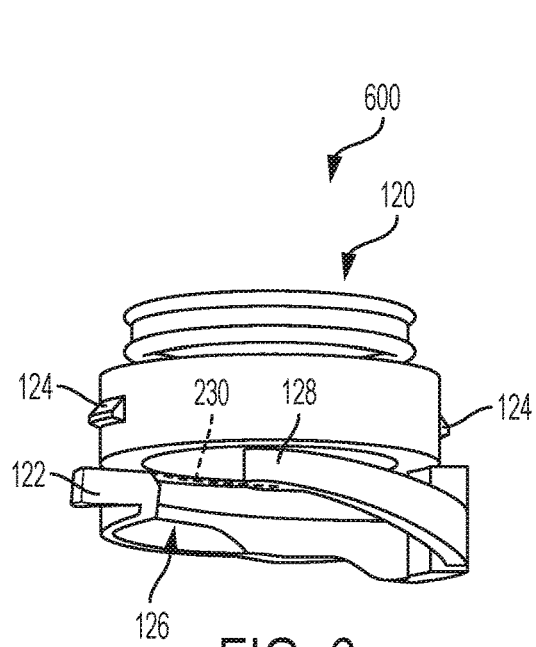
FIG. 6 is a perspective view of the middle locking portion.
Figure 7:
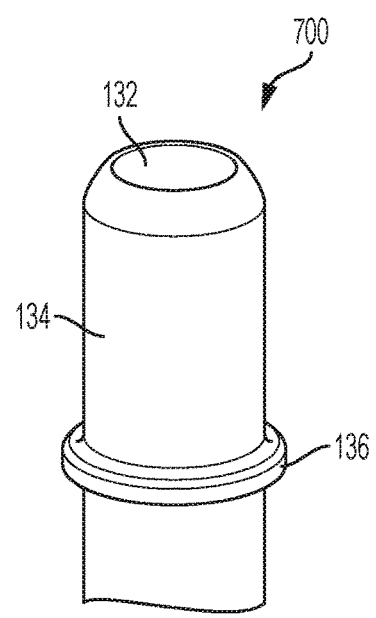
FIG. 7 is a perspective view of the inner portion.
Figure 8:
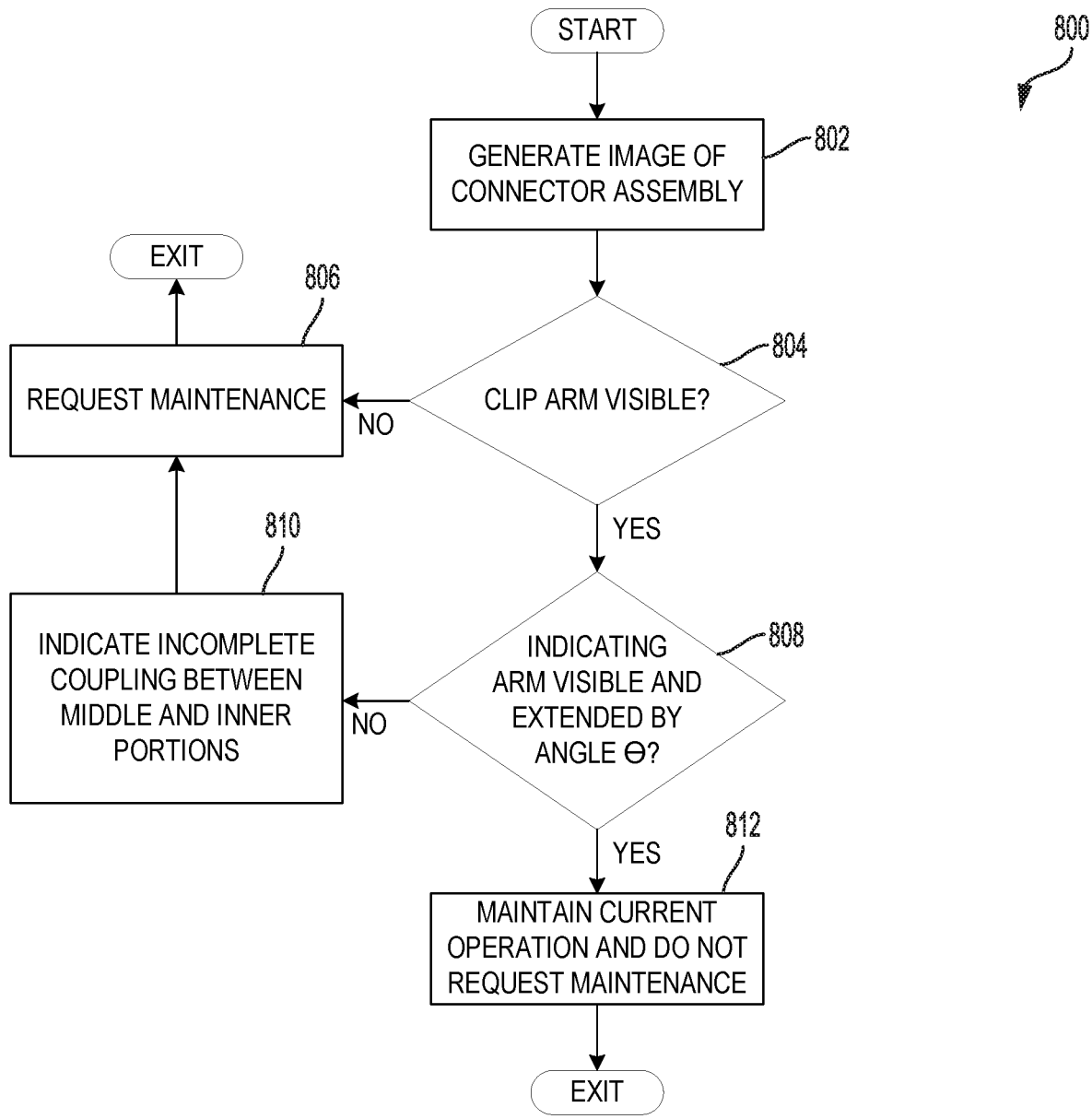
FIG. 8 is a method for determining complete coupling of the connector assembly via two different visual cues.

The following description relates to an example of a quick connect device for fuel lines comprising an indicating arm. A general cross-sectional view of the quick connect device is shown in FIG. 1. In FIG. 1, an outer portion, a middle locking portion, and an inner portion are shown post assembly to form a contiguous and uninterrupted interlocked system. In FIG. 2, a general perspective view of the fully coupled quick connect device is shown. An engagement of the middle locking portion and the outer portion is shown in FIG. 3. The indicator arm does not extend beyond an outer circumference of the quick connect device. In FIG. 4, the inner portion is shown fully engaged with the middle locking portion. As a result, the indicator arm extends through a viewing window of the outer portion. The indicator arm extends radially outward, tangential to the outer circumference of the quick connect device upon fully engaging the inner portion to the middle locking portion. FIGS. 5, 6, and 7 show perspective views of the outer portion, middle locking portion, and inner portion, respectively. FIG. 8 shows a method for determining complete coupling of the quick connect device.

FIG. 1 is a schematic diagram showing a cross-sectional view of an assembled connector system (e.g., quick connect device) 100. Such connector assemblies may be used in fuel systems to connect system components such as engines, fuel tanks, evaporative emission control canisters, etc. The connector system 100 comprises an outer portion (e.g., a quick connect housing) 110, a middle portion (e.g., a quick connect device) 120, and an inner portion (e.g., a PVC tube) 130. In FIG. 1, all three components are shown connected to each other through a middle locking mechanism of the middle portion to form a contiguous and uninterrupted interlocked sealed system. The three components enclose an annular channel for the passage of fluid in the fuel system. Such connector systems may also be used in hydraulic and/or similar fluidic systems. It will be appreciated by someone skilled in the art that the connector system may be used for other suitable forms of media transfer system and provide hermetic sealing between components.

An axes system 190 is shown comprising of two axes, the horizontal axis and the vertical axis. A central axis 195 of the assembled connector system is depicted by a dashed line. The central axis 195 is parallel to the vertical axis.

The outer portion 110 and the middle locking portion 120 may comprise of a flexible, heat resistant material such as high density polyethylene, thermoplastic, polypropylene, and polytetrafluoroethylene. The inner portion 130 may comprise of a rigid material such as polyvinylchloride (PVC). In one example, additionally or alternatively, the inner portion 130 may be a tube for a positive crankcase ventilation (PCV) system in which crankcase gases are vented out of the engine. The inner portion 130 may be fluidically coupled with the crankcase to vent crankcase gasses out of the engine block and/or head through the connector to an intake manifold of the engine via a tube coupling the connector to the engine intake manifold.

The outer portion 110 is contoured with geometrical features to allow self-engagement with the middle locking portion 120. The entire outer portion 110 with a clip arm lock 112 and pair of tab orifices 116 are molded to form a contiguous system to ensure adequate sealing of the connector system 100.

The clip arm lock 112 engages with a clip arm 122 of the middle locking portion 120 as part of the middle locking mechanism. The middle locking mechanism between the outer portion 110 and the middle locking portion 120 further comprises a pair of tabs 124 engaging with the pair of tab orifices 116. As depicted, the pair of tabs 124 are vertically higher than the clip arm 122. Therefore, the pair of tab openings 116 are correspondingly vertically higher than the clip arm lock 112. Furthermore, one of the pair of tabs 124 is directly above the clip arm 122. The pair of tabs 124 are horizontally opposite one another on either side of the middle locking portion 120. Likewise, the pair of tab orifices 116 are horizontally opposite one another on either side of the outer portion 110.

The clip arm 122 may be rotatably and slideably inserted into an opening of the clip arm lock 112 via adjustment of the clip arm 122 in the horizontal and vertical directions. The clip arm lock 112 is substantially U-shaped with the opening located between sides of the clip arm lock 112. The clip arm lock 112 may resist separation of the middle locking portion 120 by resisting movements of the clip arm 122 toward an unlocked position caused by dynamic vehicle operation (e.g., vibrations, thermal expansions/compressions, etc). The clip arm lock 112 does not prevent movement of the clip arm 122, but does decrease a range of motion of the clip arm 122 in order to decrease a likelihood of detachment.

The clip arm 122 protrudes through the opening of the clip arm lock 112 in the horizontal direction beyond an outer circumference of the connector assembly 100. In this way, the clip arm 122 is visible from outside the outer portion 110 via a vehicle operator, visualization device, etc. when the outer portion 110 and the middle locking portion 120 are fully coupled. Said another way, the two components are fully coupled when the clip arm 122 engages with the clip arm lock 112, extending radially outward in a perpendicular direction beyond the outer circumference of the connector assembly 100, and when the tabs 124 engage with the openings 116. The pair of tabs 124 protrudes through the pair of tab openings 116, but do not extend beyond the outer circumference of the connector assembly 100. Thus, the pair of tabs 124 is not visible when the middle locking portion 120 and the outer portion 110 are either partially or fully interlocked.

The middle locking portion 120 of the connector system 100 comprises geometrical features of the middle locking mechanism to couple to the outer portion 110 and inner portion 130. An interior annular recess 126 is located directly above the clip arm 122 and is sized to engage with a spigot flange 136 of the inner portion 130 in order to couple the inner portion 130 to middle locking portion 120. A combination of the clip arm 122 and the annular recess 126 may act as a retention feature in order to couple the middle locking portion 120 to the inner portion 130. The middle locking portion 120 and the inner portion 130 may be rotatably coupled such that the middle locking portion 120 may rotate about the central axis 195 when interlocked with inner portion 130, independent of also being coupled with the outer portion 110.

The spigot flange 136 circumferentially surrounds a vertical portion of a spigot 134. A vertical height of the spigot flange 136 corresponds to the vertical height of the interior annular recess 126 in order to allow the spigot flange 136 to lockably engage with the interior annular recess 126. Due to the protruding profile of the spigot flange 136, the middle locking portion 120 and the outer portion 110 are flexible and expand and contract in order to slideably insert the inner portion 130. The clip arm 122 traverses an entire circumference of the spigot flange 136 upon coupling the middle 120 and inner 130 portions.

An indicating arm 128 originates from a circular portion of the clip arm 122 and curves in an upward direction away from the clip arm. The indicating arm 128 traverses a portion of the spigot flange 136, engaging with the portion when coupling the middle 120 and inner 130 portions. The indicating arm 128 is flexible and as a result, the spigot flange 136 may push the indicating radially outward in a tangential direction beyond the outer circumference of the connector assembly 100 when the middle 120 and inner 130 portions are fully coupled. Full coupling of the middle 120 and the inner 130 portions may be defined as the spigot flange 136 being fully inserted into the annular recess 126 and sitting atop the clip arm 122. The indicating arm 128 is a visible cue signifying a complete coupling between the middle locking portion 120 and the inner portion 130 while the clip arm 122 may be a visual cue signifying a complete coupling between the outer portion 110 and the middle locking portion 120.

The spigot 134 comprises an interior passage 132 fluidly coupled to a cavity 118 of the outer portion 110. Fluid from the interior passage 132 may at least partially fill the cavity 118 without leaking to any components, specifically including the middle locking portion 120. Upper 138 and lower 139 O-rings of the middle locking portion 120, which are vertically spaced away from one another, hermetically seal the cavity 118, only allowing fluid to flow from the interior passage 132, into the cavity 118, and out through a nozzle fitting (not shown) of the outer portion 110. A detailed description of the nozzle fitting will be presented in FIG. 3.

Thus, upon fully coupling the outer portion 110 and the middle locking portion 120 via the middle locking mechanism, the clip arm 122 extends through the clip arm lock orifice 114 protruding outside the outer portion 110 independent of the inner portion 130 being engaged with the middle locking portion 120. The outer portion 110 and the middle locking portion 120 may both be at least partially flexible in order to allow the inner portion 130 to be slideably inserted into a cavity of the outer portion 110 and the middle locking portion 120. The indicating arm 128 protrudes through the outer portion 110 in response to a complete coupling between the middle locking portion 120 and the inner portion 130.

FIG. 2 shows a perspective view of the assembled connector system 100 of FIG. 1. As such, components previously introduced are numbered similarly in subsequent figures. The connector system 100 comprises of three components namely, an outer portion (e.g., a quick connect housing) 110, a middle locking portion (e.g., a quick connect device) 120, and an inner engagement portion (e.g., a PVC tube) 130. In the perspective view all three components are connected to each other through the middle locking mechanism to form a continuous system. The connector system 100 encloses a portion of an annular channel of the inner engagement portion 130 through which fluid may pass. An axes system 190 is shown comprising of two axes, the horizontal axis and the vertical axis. The three components align the vertical (e.g., axial) axis.

The outer portion 110 has a nozzle fitting 202 designed with geometrical features to allow self-engagement with the mating tube of a fuel line. The nozzle fitting 202 has a plurality of angled rings with ramps facing away from an extreme end (tip) 204 of the nozzle. An outlet near the extreme end 204 is horizontal to the central axis 195 of the connector system 100. The outer portion 110 is coupled to the middle portion 120 through a locking mechanism 220. A clip arm 122 engages with a clip arm lock 112 and extends through an opening of the clip arm lock 112 radially outward in the horizontal direction perpendicular to the outer circumference of the connector assembly 100. The locking mechanism 220 further comprises an opening (e.g., tab opening) 116 for receiving a tab 124 which engages with the opening 116 but does not extend past the outer circumference of the connector assembly 100. The engagements between the clip arm 122 and the clip arm lock 112 the tab 124 and the opening 116 may decrease movement in the horizontal and vertical directions to resist separation between the outer portion 110 and the middle locking portion 120.

The nozzle fitting 202 may receive fluid from the inner engagement portion 130 via a spigot 134 directing fluid to a cavity (e.g., cavity 118 of FIG. 1) located in an upper part of the outer portion 110 proximal to the nozzle. A direction of the flow of fluid through the connector system 100 is vertical toward the nozzle 202 and horizontal when flowing through the nozzle. Fluid does not flow downward due to sealing rings (e.g., upper 138 and lower 139 O-rings of FIG. 1) located at an upper junction between the outer portion 110 and the middle locking portion 120.

The middle locking portion 120 may further comprise a geometrical slot (e.g., interior annular recess 126) directly above the clip arm 122 for receiving a spigot flange (not shown) of the inner portion 130. As described above, the spigot flange completely traverses an outer surface of the spigot 134. The spigot flange may be sized to match the size of the geometrical slot such that a snug fit may occur when inserting the spigot flange into the geometrical slot. When the snug fit occurs, an indicating arm 128 protrudes through a viewing window 206 extending beyond the outer circumference of the connector assembly 100. A tip of the indicating arm 128 is higher along the vertical axis than an uppermost height of the clip arm 122, despite an origin (e.g., point of insertion) of the indicating arm 128 being located on the clip arm 122. In this way, the indicating arm 128 is curved in an upward direction along the vertical axis.

Line 230 shows an extent of the upward curving of the flexible indicating arm 128. An uppermost height of the clip arm 122 is vertically equal to a lower height of an extreme end of the indicating arm 128 as indicated by the line 230. As described above, the origin of the indicating arm is located on and equal in height to the clip arm 122. The indicating arm 128 curves upwardly along the vertical axis along a circumference of the clip arm 122. Thus, the indicating arm 128 lies within the circumference of the clip arm 122 and is not visible when the inner portion 130 is not coupled to the middle locking portion 120.

FIG. 3 shows a bottom-up view 300 of an outer portion 110 coupled to a middle locking portion 120. The outer portion comprises two main parts, the nozzle fitting 202 on the top and a fitting body 302 on the bottom. The individual components of the outer portion are molded together to form a continuous system. The middle locking portion comprises three main parts, a clip arm 122, a pair of tabs (e.g., pair of tabs 124), and the indicating arm 128. The individual components of the middle locking portion are molded together to form a sealed continuous system. The outer portion and the middle locking portion may both be molded of a hard yet flexible material capable of expanding and contracting due to one or more of stress and installation. The outer portion is sized corresponding to a size of the middle locking portion in order to house the middle portion.

The nozzle fitting 202 comprises a plurality of angled cylindrical rings and ramps 304 facing away from an extreme end (tip) 204 of the nozzle. The tip 204 comprises a chamfered cylindrical ring 306 coupled adjacent to the tip with an O-ring 308 located between the chamfered ring and one of the plurality of angled rings 304. The nozzle fitting 202 may be fitted with the O-ring 308 to prevent back sliding and/or detachment from externally coupled parts. The nozzle fitting 202 may be a marginally bigger thickness near the fitting body compared to near the tip 204.

The clip arm 122 is substantially circular and traverses an entire circumference of the middle locking portion 120 with clip arm tip 310 extending radially outward from the clip arm 122 in a direction perpendicular to an outer circumference of a connector assembly. A clip arm lock 112 engages with the clip arm tip 310 fully locking the middle locking portion 120 and the outer portion 110 and allowing the clip arm tip 310 to be visible. A pair of tabs of the middle locking portion are not visible when the middle portion is fully locked to the outer portion. An indicating arm 128 remains within a circumference of the middle locking portion 120 and does not extend through a viewing window of the outer portion. The indicating arm 128 traverses around a portion of an outer circumference of the middle locking portion 120. In the current view, the clip arm 122 blocks a view of an annular recess of the middle locking portion 120 for coupling the middle portion to an inner portion as described above.

The outer portion 110 and the middle locking portion 120 may produce a snug fit capable of preventing separation and receiving an inner portion (e.g., inner portion 130) into a cavity 118 of a combination of the middle portion and the outer portion. The clip arm 122 comprises a clip arm tip 310 which protrudes through the opening of the clip arm lock 112 and extends radially outward in a perpendicular direction beyond the outer circumference of the connector assembly. Thus, the clip arm tip 310 may be a visual cue indicating a full coupling between the outer portion 110 and the inner portion 120. The indicating arm 128 does not extend outside a circumference of the middle locking portion 120 when the outer 110 and middle 120 portions are fully coupled. The indicating arm 128 extends through a viewing window of the outer portion and is visible when the inner portion is fully locked with the middle locking portion as will be described with reference to FIG. 4.

FIG. 4 shows a bottom-up view 400 of the assembled connector system 100. As previously described with relation to FIGS. 1 and 2, the connector system 100 comprises three components namely, an outer portion 110, a middle locking portion 120, and an inner portion 130. In FIGS. 1 and 2 the three components of the connector system 100 are coupled together through the middle locking portion, whereas in FIG. 3, the inner portion 130 is omitted to show a coupling between the outer portion and the middle locking portion.

The inner portion 130 may be fixed to a fluid system of an engine and/or vehicle 199. The inner portion 130 comprises a passage, within the spigot 134, capable of providing fluid to other components of an engine and/or vehicle via the nozzle fitting 202. A spigot flange 136 traverses an entire outer circumference of the spigot 134 and may fit into an annular recess of the middle locking portion 120 when the two components are fully coupled. The spigot flange 136 pushes the indicating arm 128 through a viewing window of the outer portion 110 by an angle Θ and a corresponding distance 402. A portion of the indicating arm 128 traverses adjacent to a portion of the spigot flange 136 before a remaining portion of the indicating arm 128 curves upward and away from the spigot flange 136. The portions of the two components are in physical contact.

The indicating arm 128 extends radially outward in a tangential direction to the outer circumference of the connector assembly 100. As depicted, the indicating arm 128 is 180 degrees away from the nozzle fitting 202 to prevent the nozzle from eclipsing the indicating arm from a top-down perspective such that an operator and/or a visualizing machine may detect the indicating arm. The angle Θ may be greater than 0 and less than 90 degrees. Specifically, the angle Θ may be between 15-65 degrees. The distance 402 increases as the angle Θ increases. The distance 402 may be between 1-10 millimeters. The indicating arm may further comprise an ingot (marking) on an upper surface adjacent the profile of the outer portion 110 such that the operator and/or visualizing machine may determine a full coupling between the inner portion 130 and the middle locking portion 120 solely via visualizing the marking.

The assembled connector system 100 provides two visual aids, the clip arm 122 and the indicating arm 128, for an operator and/or a machine to determine if the connector system is fully locked. If one or more of the clip arm 122 and the indicating arm 128 is not visible, then it may be determined by the user and/or the machine that the connector system is not fully coupled and that maintenance is desired. A method for determining if the connector system 100 is fully locked will be described with reference to FIG. 8.

In one example, when viewed along the central axis as in FIG. 4, a machine vision system may have a predetermined threshold (dashed circle 301) which is compared to an image capture of the extension of arm 128. If any piece of the arm extends outside the threshold circle, the vision system can determine the state of the installation (correct, vs. incorrect). In one example, the machine vision system may include instructions stored in memory, as well as a camera, in order to capture an image of the engine during assembly on the assembly line when the engine is in a specified location (e.g., as determined via a position sensor sensing engine position on the line). Once the engine is at the desired location, the instructions may communicate to the camera to capture an image. Then, the instructions may take the digital image, and add the threshold circle 301 as a specified location on the central axis of the connector (as predetermined from engine position or as determined by digital analysis of the image). Then, the arm extension position and/or angle may be determined by the system based on the digital image and compared with the threshold circle to determine proper connection as described herein. In response to improper connection, a warning can be generated, including a communication message sent to a monitoring system, a visual warning, or others. In one example, the digital image may be displayed with the threshold circle so that an operator can determine the correctness of the connection in addition to or in place of the electronic instructions stored in memory.

FIG. 5 shows a perspective view 500 of an outer portion 110 of the connector assembly 100 with a nozzle fitting 202. The individual components of the outer portion are molded together to form a sealed continuous system.

An axes system 190 is shown comprising of two axes, a horizontal axis and a vertical axis. The outer portion 110, has a central axis 195 as depicted by a dashed line. The nozzle fitting 202 also has a central axis 502 depicted by a dashed line. The nozzle central axis 502 is perpendicular to the central axis 195. In one embodiment, the nozzle fitting 202 may be acutely angled to or parallel to the central axis 195.

As described above, the nozzle fitting 202 comprises a plurality of angled cylindrical rings and ramps 304 facing away from an extreme end (tip) 204 of the nozzle. The tip 204 comprises a chamfered cylindrical ring 306 coupled adjacent to the tip with an O-ring 308 located between the chamfered ring and one of the plurality of angled rings 304. The nozzle fitting 202 may be fitted with the O-ring 308 to prevent back sliding and/or detachment from externally coupled parts. The nozzle fitting 202 may be a marginally bigger thickness near the fitting body 302 compared to near the tip 204.

The fitting body 302 may be marginally smaller near the nozzle fitting 202 compared to near the clip arm lock 112 to accommodate a middle locking portion. An opening 116 for receiving a tab of the middle locking portion is vertically above the clip arm lock 112 along a periphery of the outer portion 110. The clip arm lock 112 is substantially U-shaped and sized corresponding to a size of a clip arm of the middle locking portion such that a range of movement of the clip arm is decreased when the two components are engaged. The clip arm lock 112 may be curved and follow an outer circumference of the outer portion 110. A viewing window 206 is located between the clip arm lock 112 and a bottom 504 of the outer portion on a side opposite the nozzle fitting 202. The viewing window 206 may traverse 10-75% of the entire outer circumference of the outer portion 110.

FIG. 6 shows a perspective view 600 of a middle locking portion 120 of a connector assembly 100 comprising a clip arm 122 and an indicating arm 128. The middle locking portion 120 comprises the locking mechanism for coupling the middle portion to the outer and inner portions of the connector system. The individual components of the middle locking portion are molded together to form a sealed continuous system. An axes system 190 is shown comprising two axes, the horizontal axis and the vertical axis. The central axis 195 of the middle portion is shown by a dashed line.

The clip arm 122 is circular, traversing an entire outer circumference of the middle locking portion 120. A clip arm tip 310 extends radially outward in a perpendicular direction to the outer circumference of the connector assembly and is able to engage with the clip arm lock of the outer portion. An annular recess 126, as indicated by a striped box, is directly above and shaped via the clip arm 122 and engages with the spigot flange of the inner portion. Thus, the clip arm 122 may be used to couple the inner portion to the middle portion 120.

An indicating arm 128 originates from the clip arm 122 and upwardly curves away from the clip arm 122 traversing a portion of the annular recess 126. Thus, a portion of the indicating arm 128 comes into contact with and may be pushed radially outwardly by the spigot flange. A bottom of a tip of the indicating arm 128 is substantially equal in height to a highest portion of the clip arm 122, as shown by dashed line 230. When the annular recess 126 is fully coupled to the spigot flange of the inner portion, the spigot flange presses against the indicating arm 128, pushing the indicating arm 128 radially outward in a tangential direction to the outer circumference of the middle locking portion 120. The indicating arm 128 may extend through a viewing window of the outer portion of the connector assembly in order to provide a visual cue indicating the inner portion is fully coupled to the middle locking portion 120.

FIG. 7 shows a perspective view 700 of an inner portion 130 of the connector assembly. The central axis 195 of the inner portion 130 is shown by a dashed line. An axes system 190 is shown comprising two axes, the horizontal axis and the vertical axis. A spigot 134, which may be a spigot of an engine, such as a fuel line, air line, vapor line, and/or PCV line, etc., of the engine, traverses vertically along the central axis 195 with a fluid passage 132 located therein for transferring fluid from one vehicle compartment to another with assistance from the connector assembly, specifically the outer portion. Fluid from the fluid passage 132 flows into a chamber of the outer portion before flowing horizontally into the nozzle fitting of the outer portion to be directed to different locations of a vehicle (e.g., an engine).

A spigot flange 136 traverses a portion of the spigot 134 along an exterior surface of the spigot 134 along its entire outer circumference. The spigot flange 136 lockably fits into an annular recess of the middle locking portion to couple the bottom and middle portions. As described above, an indicating arm of the middle portion protrudes from outside of a profile of the middle portion and acts as a visual cue indicating a full lock between the inner portion 130 and the middle portion 120.

FIGS. 1-7 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example.

FIG. 8 illustrates a method 800 for determining a full connection of the outer and inner portion to the middle locking portion of the connector assembly. The method 800 may be conducted by a machine.

The method may comprise generating an image of a quick connect device coupled to an engine on a manufacturing line, digitally measuring, via the image, one or more of an angle and a distance between a flexible indicating arm and an outer circumference of the quick connect device and a protrusion of a clip arm, and adjusting subsequent manufacturing operation of the line in response to an indication of less than full engagement of the quick connect device based on the measured angle, distance, or protrusion. A machine may generate the image and digitally measure a protrusion of one or more of the clip arm and/or the indicating arm. The machine may further measure the angle and distance between the indicating arm and the quick connect device. The machine may notify an operator of a full engagement or a less than full engagement of the quick connect device. Subsequent manufacturing operations may be altered in response to the less than full engagement indication.

The method 800 begins at 802, where the method 800 includes generating an image of the connector assembly for analysis. The image may be generated from a top-down perspective in order to visualize the visual cue on the connector assembly. The image may be taken by a camera attachment of the machine or by an operator. The operator may then upload the image to the machine for digital processing. As described above, a clip arm tip and an indicating arm may protrude from outside a profile of the connector assembly and provide visual cues regarding a degree of coupling between the outer and inner portions with the middle locking portion, respectively. The picture may be analyzed by a machine where an angle $\Theta$ and a distance between an extreme end (tip) of the indicating arm and the outer circumference of the connector assembly are measured.

At 804, the method 800 includes determining if the clip arm of the middle locking portion is visible. The clip arm protrudes through and engages with a clip arm lock of the outer portion. The clip arm may either be fully extended through the clip arm lock or not extended at all. If the clip arm is not visible, then the method 800 proceeds 806 to indicate a maintenance request of the connector assembly notifying an operator of an incomplete connection between the outer portion and the middle locking portion. Furthermore, the machine may alter subsequent manufacturing operation of the connector assembly in response to the clip arm not being fully extended.

If the clip arm is visible and the outer portion is fully coupled to the middle locking portion, then the method 800 proceeds to 808 to determine if the indicator arm is outside the viewing window by measuring one or more of the angle $\Theta$ and the distance between the tip of the indicating arm and the outer circumference of the connector assembly. If the angle $\Theta$ is less than a threshold angle or if the distance is less than a threshold distance, then the method 800 proceeds to 810 to indicate an incomplete coupling between the inner portion and the middle locking portion and to request a maintenance of the connector assembly. The threshold angle and the threshold distance may be based on an angle or a distance corresponding to an indication of the inner portion being fully coupled with the middle locking portion.

If the clip arm is visible and the inner portion is fully coupled to the middle portion, then the method 800 proceeds to 812 and maintains current operation and does not request maintenance of the connector assembly. In this way, both the visual cues are and indicate a complete coupling between outer and inner portions to the middle locking portion.

In this way, a connector assembly may comprise two visual cues indicating a complete connection between outer and inner portions with the middle locking portion. A first visual cue includes a clip arm which extends through an opening of a clip arm lock, indicating a complete coupling between the outer portion and the middle locking portion. A second visual cue includes an indicating arm which protrudes through a viewing window of the outer portion, indicating a complete coupling between the inner portion and the middle locking portion. The technical effect of using two visual cues to indicate different couplings of the connector assembly is to prevent incomplete installation of the connector assembly and decrease degradation of the connector assembly.

A quick connect device includes a middle portion with a first extendable arm protruding radially outward over a protrusion of an inner portion, and a second flexibly extendable arm above the first arm that is pushed radially outward by the protrusion only when an annular recess of the middle portion is fully engaged with the protrusion and a separate, axially aligned outer portion having a window exposing and enabling the second arm of the middle portion to be extended when fully engaged with the inner portion. In a first example of the quick connect device, the outer and inner portions are coupled to the middle portion. In a second example of the quick connect device optionally includes the first example and further includes wherein the first extendable arm protrudes radially outward in a perpendicular direction beyond an outer circumference of the quick connect device. In a third example of the quick connect device optionally includes one or more of the first and second example, and further includes wherein the second flexibly extendable arm extends radially outward in a tangential direction beyond an outer circumference of the quick connect device. In a fourth example of the quick connect device optionally includes one or more of the first through third examples, and further includes wherein the second flexibly extendable arm curves up and away from the protrusion of the inner portion. In a fifth example of the quick connect device optionally includes one or more of the first through fourth examples, and further includes wherein the inner portion is inflexible and the outer and middle portions are flexible. In a sixth example of the quick connect device optionally includes one or more of the first through fifth examples, and further includes wherein the middle portion further comprises a pair of tabs located on opposite sides of the middle portion and vertically above the flexible arms. In a seventh example of the quick connect device optionally includes one or more of the first through sixth examples, and further includes wherein the outer portion further comprises a pair of openings for receiving the pair of tabs of the middle portion.

A method for a quick connect device comprising visualizing a quick connect device, measuring one or more of an angle and a distance between a flexible indicating arm and an outer circumference of the quick connect device and a protrusion of a clip arm, and indicating a full engagement of an outer portion and an inner portion with a middle portion of the quick connect device based on the measured angle, distance, and protrusion. In a first example of the method, further comprising a visualizing machine for imaging the quick connect device, measuring the indicating and clip arm, and indicating the full engagement of the quick connect device. A second example of the method optionally includes the first example and further includes wherein the machine indicates the full engagement when the measured angle is greater than a threshold angle, the distance is greater than a threshold distance, and the clip arm is visible. A third example of the method optionally includes one or more of the first and second example, and further includes wherein the machine indicates incomplete engagement in response to one or more of the measured angle being less than a threshold angle, the distance being less than a threshold distance, and the clip arm not being visible.

A connector assembly comprising an outer portion, a middle locking portion, and an inner portion, where the outer portion and the inner portion couple to the middle locking portion to enclose an annular channel of the inner portion to guide fluid, a nozzle fitting of the outer portion horizontal to a central axis of the connector assembly, a clip arm of the middle locking portion extending radially outward in a perpendicular direction beyond an outer circumference of the connector assembly in response to the middle locking portion fully engaging with the outer portion, and an indicating arm of the middle locking portion extending through a viewing window of the outer portion radially outward in a tangential direction beyond the outer circumference in response to the middle locking portion fully engaging with the inner portion of the connector assembly. In a first example of the connector assembly the viewing window is on an opposite side of the outer portion compared to a location of the nozzle fitting. A second example of the connector assembly optionally includes the first example and further includes wherein the inner portion comprises a flange for lockably engaging with an annular recess adjacent to the clip arm and to a portion of the indicating arm of the middle portion, and where the flange pushes the indicating arm to extend through the viewing window. A third example of the connector assembly optionally includes one or more of the first and second examples, and further includes wherein the indicating arm curves upward and away from the annular recess. A fourth example of the connector assembly optionally includes one or more of the first and third examples, and further includes wherein the outer portion and the middle locking portion are flexible. A fifth example of the connector assembly optionally includes one or more of the first and fourth examples, and further includes wherein the inner portion is a rigid PVC tube of an engine. A sixth example of the connector assembly optionally includes one or more of the first and fifth examples, and further includes wherein the indicating arm is angled to the outer circumference of a fully coupled connector assembly and is a distance away from the outer circumference. A seventh example of the connector assembly optionally includes one or more of the first and sixth examples, and further includes wherein the indicating arm and the clip arm are visible for the fully coupled connector assembly by a visualization device.

A method for manufacturing a connector assembly comprising generating an image of a quick connect device coupled to an engine on a manufacturing line, digitally measuring, via the image, one or more of an angle and a distance between a flexible indicating arm and an outer circumference of the quick connect device and a protrusion of a clip arm, and adjusting subsequent manufacturing operation of the line in response to an indication of less than full engagement of the quick connect device based on the measured angle, distance, or protrusion. A first example of the method further includes a visualizing machine for generating the image of the quick connect device, digitally measuring the angle and the distance, and indicating the full engagement of the quick connect device. In a second example optionally including the first example the method further includes the machine indicating the full engagement when the measured angle is greater than a threshold angle, the distance is greater than a threshold distance, and the clip arm is visible. In a third example optionally including one or more of the first and second example the method further includes the machine indicating less than full engagement in response to one or more of the measured angle being less than a threshold angle, the distance being less than a threshold distance, and the clip arm not being visible and further adjusts subsequent manufacturing operation.

Note that the example control and estimation routines included herein can be used with various engine and/or vehicle system configurations. The control methods and routines disclosed herein may be stored as executable instructions in non-transitory memory and may be carried out by the control system including the controller in combination with the various sensors, actuators, and other engine hardware. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the engine control system, where the described actions are carried out by executing the instructions in a system including the various engine hardware components in combination with the electronic controller.

In another representation, an engine system is provided including an engine PCV outlet and a connector assembly coupled directly thereto, the connector assembly comprising an outer portion, a middle locking portion, and an inner portion, where the outer portion and the inner portion couple to the middle locking portion to enclose an annular channel of the inner portion to guide fluid; a nozzle fitting of the outer portion horizontal to a central axis of the connector assembly; a clip arm of the middle locking portion extending radially outward in a perpendicular direction beyond an outer circumference of the connector assembly in response to the middle locking portion fully engaging with the outer portion; and an indicating arm of the middle locking portion extending through a viewing window of the outer portion radially outward in a tangential direction beyond the outer circumference in response to the middle locking portion fully engaging with the inner portion of the connector assembly.

It will be appreciated that the configurations and routines disclosed herein are exemplary in nature, and that these specific embodiments are not to be considered in a limiting sense, because numerous variations are possible. For example, the above technology can be applied to V-6, I-4, I-6, V-12, opposed 4, and other engine types. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A quick connect device, comprising:
   a middle portion with a first extendable arm protruding radially outward over a protrusion of an inner portion, and a second flexibly extendable arm above the first arm that is pushed radially outward by the protrusion only when an annular recess of the middle portion is fully engaged with the protrusion; and
   a separate, axially aligned outer portion having a window exposing and enabling the second arm of the middle portion to be extended when fully engaged with the inner portion, wherein the first extendable arm protrudes radially outward in a perpendicular direction beyond an outer circumference of the quick connect device.

2. The quick connect device of claim 1, wherein the outer and inner portions are coupled to the middle portion.

3. The quick connect device of claim 1, wherein the second flexibly extendable arm extends radially outward in a tangential direction beyond an outer circumference of the quick connect device.

4. The quick connect device of claim 1, wherein the second flexibly extendable arm curves up and away from the protrusion of the inner portion.

5. The quick connect device of claim 1, wherein the inner portion is inflexible and the outer and middle portions are flexible.

6. A quick connect device, comprising:
   a middle portion with a first extendable arm protruding radially outward over a protrusion of an inner portion, and a second flexibly extendable arm above the first arm that is pushed radially outward by the protrusion only when an annular recess of the middle portion is fully engaged with the protrusion; and
   a separate, axially aligned outer portion having a window exposing and enabling the second arm of the middle portion to be extended when fully engaged with the inner portion, wherein the middle portion further comprises a pair of tabs located on opposite sides of the middle portion and vertically above the flexible arms.

7. The quick connect device of claim 6, wherein the outer portion further comprises a pair of openings for receiving the pair of tabs of the middle portion.

8. A connector assembly, comprising:
an outer portion, a middle locking portion, and an inner portion, where the outer portion and the inner portion couple to the middle locking portion to enclose an annular channel of the inner portion to guide fluid;
a nozzle fitting of the outer portion horizontal to a central axis of the connector assembly;
a clip arm of the middle locking portion extending radially outward in a perpendicular direction beyond an outer circumference of the connector assembly in response to the middle locking portion fully engaging with the outer portion; and
an indicating arm of the middle locking portion extending through a viewing window of the outer portion radially outward in a tangential direction beyond the outer circumference in response to the middle locking portion fully engaging with the inner portion of the connector assembly.

9. The connector assembly of claim 8, wherein the viewing window is on an opposite side of the outer portion compared to a location of the nozzle fitting.

10. The connector assembly of claim 8, wherein the inner portion comprises a flange for lockably engaging with an annular recess adjacent to the clip arm and to a portion of the indicating arm of the middle locking portion, and where the flange pushes the indicating arm to extend through the viewing window.

11. The connector assembly of claim 10, wherein the indicating arm curves upward and away from the annular recess.

12. The connector assembly of claim 8, wherein the outer portion and the middle locking portion are flexible.

13. The connector assembly of claim 8, wherein the inner portion is a rigid tube of an engine.

14. The connector assembly of claim 8, wherein the indicating arm is angled to an outer circumference of a fully coupled connector assembly and is a distance away from the outer circumference.

15. The connector assembly of claim 14, wherein the indicating arm and the clip arm are visible for the fully coupled connector assembly by a visualization device.

* * * * *